(12) United States Patent
Zhang

(10) Patent No.: US 7,585,600 B2
(45) Date of Patent: *Sep. 8, 2009

(54) METHOD AND APPARATUS FOR PERFORMING TARGET-IMAGE-BASED OPTICAL PROXIMITY CORRECTION

(75) Inventor: Youping Zhang, Newark, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/112,908

(22) Filed: Apr. 30, 2008

(65) Prior Publication Data

US 2008/0201686 A1 Aug. 21, 2008

Related U.S. Application Data

(60) Continuation of application No. 11/325,211, filed on Jan. 3, 2006, now Pat. No. 7,382,912, which is a division of application No. 10/426,583, filed on Apr. 29, 2003, now Pat. No. 7,005,218.

(51) Int. Cl.
*G03F 9/00* (2006.01)
*G06F 17/50* (2006.01)
*G06K 9/00* (2006.01)
*G03B 27/42* (2006.01)

(52) U.S. Cl. .............................. 430/5; 430/30; 382/144; 716/19; 716/21; 702/85

(58) Field of Classification Search .................... 430/5, 430/30; 716/2, 19, 21; 355/53; 382/144; 702/85

See application file for complete search history.

(56) References Cited

U.S. PATENT DOCUMENTS

| 6,653,026 | B2 | 11/2003 | Pierrat et al. | |
|---|---|---|---|---|
| 6,763,514 | B2 | 7/2004 | Zhang | |
| 6,807,663 | B2 | 10/2004 | Cote et al. | |
| 7,005,218 | B2 * | 2/2006 | Zhang | 430/5 |
| 7,382,912 | B2 * | 6/2008 | Zhang | 382/144 |

* cited by examiner

*Primary Examiner*—Christopher G Young
(74) *Attorney, Agent, or Firm*—Park, Vaughan & Fleming LLP

(57) ABSTRACT

A system that performs target-image-based optical proximity correction on masks that are used to generate an integrated circuit is presented. The system operates by first receiving a plurality of masks that are used to expose features on the integrated circuit. Next, the system computes a target image for a target feature defined by the plurality of masks, wherein mask features from different masks define the target image. The system dissects the feature into a plurality of segments, wherein dissecting the mask feature involves using dissection parameters associated with geometric characteristics of the target image, instead of using dissection parameters associated with geometric characteristics of the mask feature. The system then performs an optical proximity correction (OPC) operation on the plurality of masks, wherein the OPC operation uses parameters associated with geometric characteristics of the target image to perform optical proximity correction on the mask features that define the target image.

20 Claims, 9 Drawing Sheets

METHOD AND APPARATUS FOR PERFORMING TARGET-IMAGE-BASED OPTICAL PROXIMITY CORRECTION

RELATED APPLICATION

This application is a continuation of, and hereby claims priority under 35 U.S.C. § 120 to, a pending parent application, U.S. patent application Ser. No. 11/325,211, entitled "Method and Apparatus for Performing Target-Image-Based Optical Proximity Correction," by the same inventor as the instant application, and filed on 3 Jan. 2006. This parent application is itself a divisional of a grandparent application, U.S. patent application Ser. No. 10/426,583, entitled "Method and Apparatus for Performing Target-Image-Based Optical Proximity Correction," by the same inventor as the instant application, and filed on 29 Apr. 2003 (U.S. Pat. No. 7,005,218). The present application hereby claims priority under 35 U.S.C. § 120 to this grandparent application.

BACKGROUND

1. Field of the Invention

The invention relates to the process of fabricating integrated circuits. More specifically, the invention relates to a method and an apparatus for performing target-image-based proximity correction for advanced photomasks during fabrication of an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are generally formed of chrome, and light-transmissive clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some type of electromagnetic radiation source together with suitably adapted masks and lithography equipment.

This image is reduced and focused through an optical system containing a number of lenses, filters, and mirrors. The light passes through the clear regions of the mask and exposes the underlying photoresist layer. At the same time, opaque regions of the mask block the light leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

As integration densities continue to increase, it is becoming necessary to use phase-shifters to define more and more features within a layout. In addition to the mask containing these phase-shifters, a separate trim mask is used to selectively expose portions of the photoresist to correct (trim) the exposed areas of the photoresist to more accurately form the desired features of the integrated circuit. This is commonly known as a double exposure alternating aperture phase shift mask (AAPSM).

One problem that occurs during the optical lithography process is corner rounding. Corner rounding is caused by optical effects such as light being diffracted around the corner, and by uneven etching of the photoresist at the corner. Outside corners tend to cause the exposed image to be rounded inward, whereas inside corners tend to cause the exposed image to be rounded outward. An optical proximity correction (OPC) process adds corrections or serifs to the corners in the masks so that the exposed image comes closer to agreeing with the target image. As a convenience, the term OPC is used in the most general sense to encompass any and all types of proximity corrections performed as part of the design and lithography process. In any given design flow, the user may have an option to control which of the different types of proximity correction the OPC software will apply.

For conventional simple photomasks such as binary masks, the mask image corresponds well to the intended target wafer image. For example, an intended corner in the wafer appears to be a corner as well on the mask. Hence, the corresponding OPC strategies have mostly been focused on the mask features. However, in advanced photomasks such as double exposure AAPSM, the mask images do not directly correspond to the desired wafer image. An OPC process that targets the mask image or feature may not be effective as for a simple photomask as seen in the example below.

FIG. 1A illustrates a phase shift mask 102 for creating a feature on an integrated circuit. Phase shift mask 102 includes 0-degree phase shifter 104 and 180-degree phase shifter 106. During operation, electromagnetic radiation is passed through the 0-degree phase shifter 104 and 180-degree phase shifter 106. Optical interference caused by the difference in phase of the shifters causes the underlying photoresist between the two shifters to be left unexposed to help form a printed feature on an integrated circuit.

FIG. 1B illustrates a binary or trim mask used in conjunction with the phase shift mask for creating a feature on an integrated circuit. Binary mask 108 includes trim feature 110. Trim feature 110 can be formed from an opaque material such as chrome. During a second exposure of the photoresist using binary mask 108, the printed feature on the integrated circuit is further defined. The remaining areas of the mask 108 may include phase shifting features and/or attenuated material as appropriate.

FIG. 1C illustrates a desired feature 120 (lighter stipple and rectangular solid outline) and a printed feature 118 (darker stipple and curved solid outline) created by using the phase shift mask 102 and the binary mask 108 to expose a wafer. Desired feature 120 represents the desired feature to be printed on the integrated circuit, while printed feature 118 represents what is actually printed on the integrated circuit. The outlines of 0-degree phases shifter 104, 180-degree phase shifter 106, and trim feature 110 are shown for reference. Printed feature 118 includes several areas that differ from desired feature 120. In line end area pullback and rounding of the end of printed feature 118 caused by diffraction effects and resist effects is visible. Area 112 shows bulges in printed feature 118 caused by corner effects of phase shifters 104 and 106, and trim feature 110. Area 116 shows portions of printed feature 118 that are too narrow, possibly caused by edge diffraction effects. An optical proximity correction (OPC) process is therefore used in an attempt to make printed feature 118 more closely match desired feature 120 as described below in conjunction with FIGS. 2A-D.

FIG. 2A illustrates edges 202 on phase shifters 104 and 106 and edges 204 on trim feature 110 used to create a printed feature on an integrated circuit (both shown with thicker solid lines). Note that neither phase shifters 104 and 106 nor trim feature 110 individually describes the desired printed feature. The desired printed feature is evident only from the combination of exposing the photoresist through phase shifters 104 and 106, and trim feature 110.

FIG. 2B illustrates dissection points and evaluation points on phase shifter edges 202 and trim feature edges 204. During a traditional, mask image-based OPC process, edges 202 and 204 are dissected as illustrated at 206 and evaluation points are selected as illustrated at 208. Note that only some dissection points and evaluation points are numbered for simplicity. Short horizontal lines indicate the dissection points, while an "X" indicates evaluation points. During the OPC process each segmented edge based on the dissection points will be biased in or out according to computations made at the evaluation point to help the final image more closely approximate the target layout.

FIG. 2C illustrates the results of optical proximity correction on phase shifters 104 and 106, and trim feature 110. The OPC process follows shifter corner-to-corner minimum spacing rules at location 210. Shifter corner-to-corner minimum spacing rules are mask making requirements, and are also used sometimes to prevent certain potential printability problems. According to the mask images, areas 212 are corners and hence are corrected using tolerances and thresholds specified for corners. Hammerhead 216 is used to alleviate line end shortening problems. Similar to shifter corner-to-corner minimum spacing rules, trim corner minimum width rules apply at area 214.

FIG. 2D illustrates a printed feature 118 created from the corrected phase shifters 104 and 106, and from trim feature 110. Outlines for phase shifters 104 and 106 and trim feature 110 are shown for reference. Note that while the line ends and line edges are closer to desired feature 120, there is still a bulge at 218 due to insufficient compensation for the corner rounding effects of both masks.

Hence, what is needed is a method and an apparatus for performing optical proximity correction while minimizing the problems described above.

SUMMARY

One embodiment of the invention provides a system that performs target-image-based optical proximity correction on masks that are used to generate an integrated circuit. The system operates by first receiving a plurality of masks that are used to expose features on the integrated circuit. Next, the system computes a target image for a target feature defined by the plurality of masks, wherein mask features from different masks define the target image. The system then dissects the mask feature into a plurality of segments, wherein dissecting the mask feature involves using dissection parameters associated with geometric characteristics of the target image, instead of using dissection parameters associated with geometric characteristics of the mask feature. The system then performs an optical proximity correction (OPC) operation on the plurality of masks, wherein the OPC operation uses parameters associated with geometric characteristics of the target image to perform optical proximity correction on the mask features that define the target image.

In a variation on this embodiment, different OPC parameters are associated with line edges, space edges, outer corners, inner corners, line ends, and slot ends of the target image.

In a variation on this embodiment, performing optical proximity correction on a mask feature involves placing evaluation points on the plurality of segments, and using the dissection and the associated evaluation points in performing an OPC operation on the feature.

In a further variation, placing evaluation points on the mask feature involves using evaluation point placement rules associated with geometric characteristics of the target image, instead of using evaluation point placement rules associated with geometric characteristics of the mask feature.

In a further variation, performing an OPC operation on the mask feature involves using a resist threshold associated with geometric characteristics of the target feature instead of geometric characteristics of the mask feature.

In a further variation, performing an OPC operation on the mask feature involves using tolerances associated with geometric characteristics of the target feature instead of tolerances associated with geometric characteristics of the mask feature.

In a variation of this embodiment, the set of different masks includes at least one phase-shift mask and at least one trim mask.

DETAILED DESCRIPTION

Overview

In conventional binary photomasks, the geometric mask pattern is usually directly reflected in the intended pattern on the wafer. Therefore, OPC processes based on mask images can give adequate compensation to the proximity effect to achieve a desirable wafer image. As we are dealing with more advanced photomasks, particularly with multiple exposures, the original mask image may not correctly reflect the intended wafer image. In these cases, the conventional OPC strategy, which focuses on mask geometries, will not result in a good wafer image. Therefore, it is necessary to focus on the intended wafer images, which could be significantly different from the mask images. On the other hand, each mask is exposed individually and will still exhibit mask properties (e.g. corner rounding) therefore it is necessary to compensate for single mask effects and obey mask rules.

Mask Features

Figure 3B:
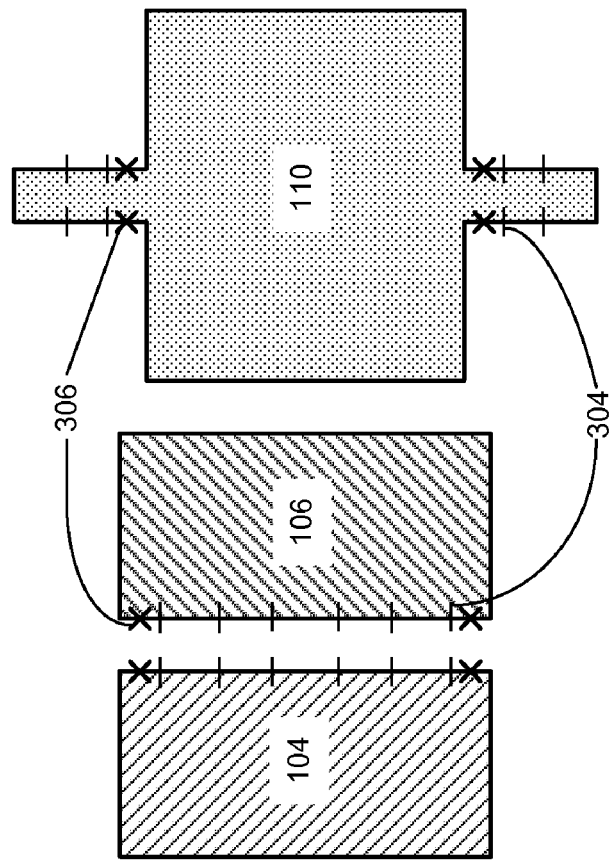
FIG. 3B illustrates edge dissection and evaluation point placement on the phase shifters and trim features of FIG. 3A in accordance with an embodiment of the invention.
Figure 3A:
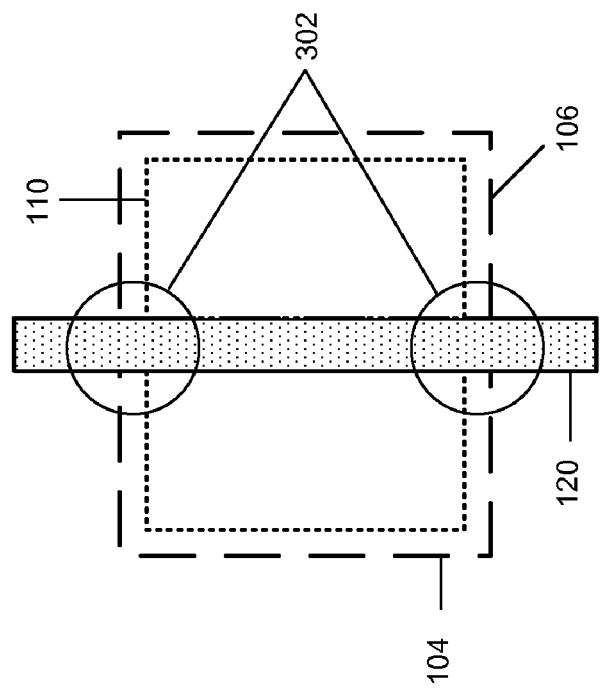
FIG. 3A illustrates features associated with corrections in accordance with an embodiment of the invention.

FIG. 3A illustrates aspects associated with corrections in accordance with an embodiment of the invention. Areas 302 are line edges of the feature defined by the desired printed image 120—or alternatively in an original layout prior to its separation into multiple layouts for multiple mask lithographic reproduction. Outlines are shown for phase shifters 104 and 106 (longer dashed lines) and for trim feature 110 (short dashed lines) for reference.

FIG. 3B illustrates dissection and evaluation point placement based on edge features in accordance with an embodiment of the invention. During the optical proximity correction (OPC) process, phase shifters 104 and 106, and trim feature 110 are dissected as shown at 304. The dissection at the shifter outer corners and trim inner corners is done on dissection rules for edges to achieve the best line width and uniformity control, while taking into account mask rule constraints such as minimum serif size. After dissection, evaluation points 306 are placed according to evaluation point placement rules for line edges, not corners.

Figure 3D:
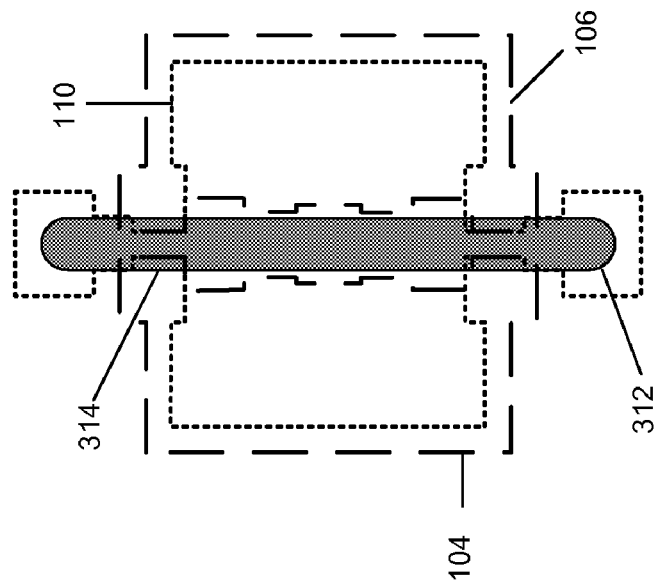
FIG. 3D illustrates a printed feature printed using the phase shifters and trim features of FIG. 3C in accordance with an embodiment of the invention.
Figure 3C:
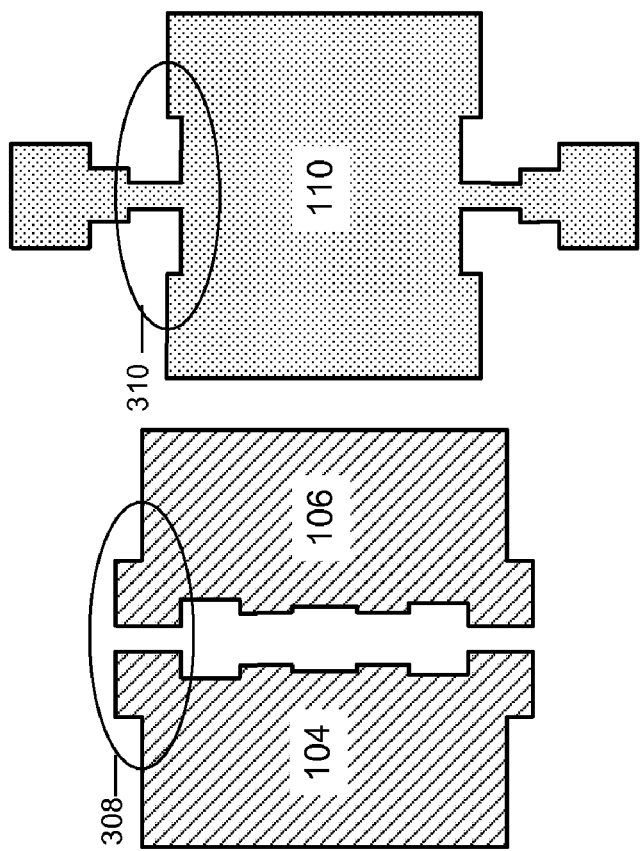
FIG. 3C illustrates optical proximity corrections on the phase shifters and trim features of FIG. 3B in accordance with an embodiment of the invention.

FIG. 3C illustrates the mask layouts after optical proximity corrections are applied in accordance with an embodiment of the invention. After evaluation points 306 have been placed, OPC is performed on phase shifters 104 and 106 and on trim feature 110. Areas 308 and 310 receive correction features for corners, based on tolerances and resist thresholds for line edges. For example, corner serifs are used instead of edge biases. This gives better corner rounding compensation and hence results in straighter lines. These corrections obey the mask minimum spacing and width rules for corners.

Figure 1C:
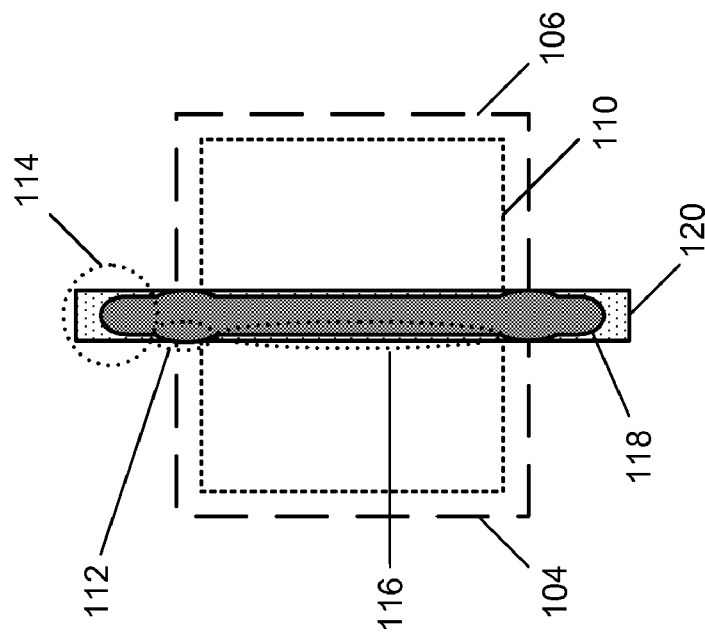
FIG. 1C illustrates a desired feature and a printed feature created by using the phase shift mask of FIG. 1A and the binary mask of FIG. 1B.
Figure 1B:
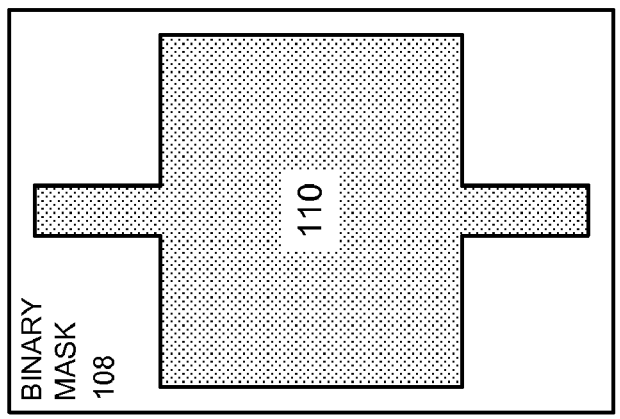
FIG. 1B illustrates a binary or trim mask used in conjunction with the phase shift mask of FIG. 1A for creating a feature on an integrated circuit.
Figure 1A:
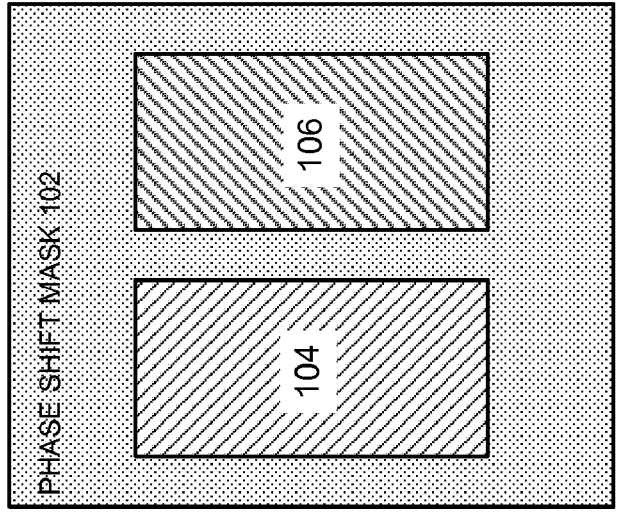
FIG. 1A illustrates a phase shift mask for creating a feature on an integrated circuit.
Figure 2B:
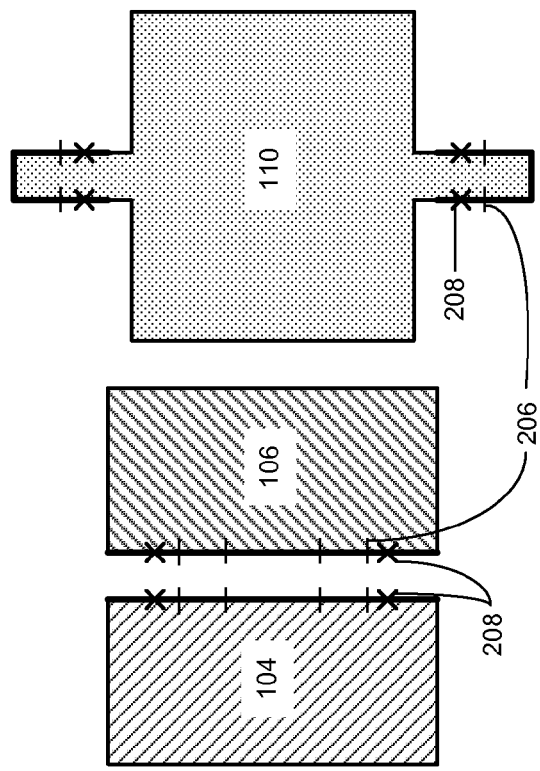
FIG. 2B illustrates dissection points and evaluation points on phase shifter and trim feature edges from FIG. 2A.
Figure 2A:
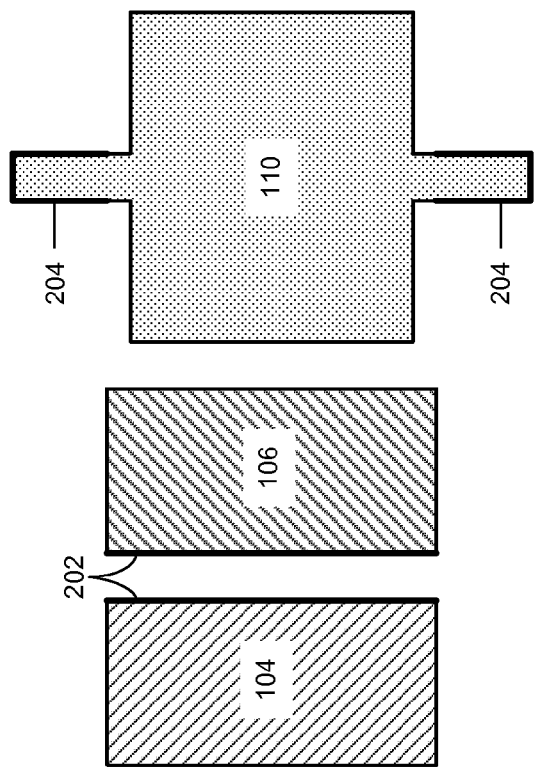
FIG. 2A illustrates edges on phase shifters and trim features used to create a printed feature on an integrated circuit.
Figure 2D:
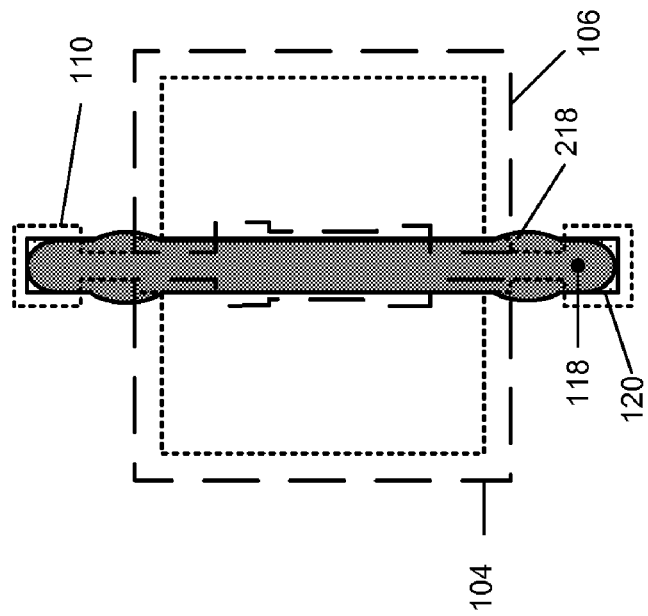
FIG. 2D illustrates a printed feature created from the corrected phase shifters and trim features of FIG. 2C.
Figure 2C:
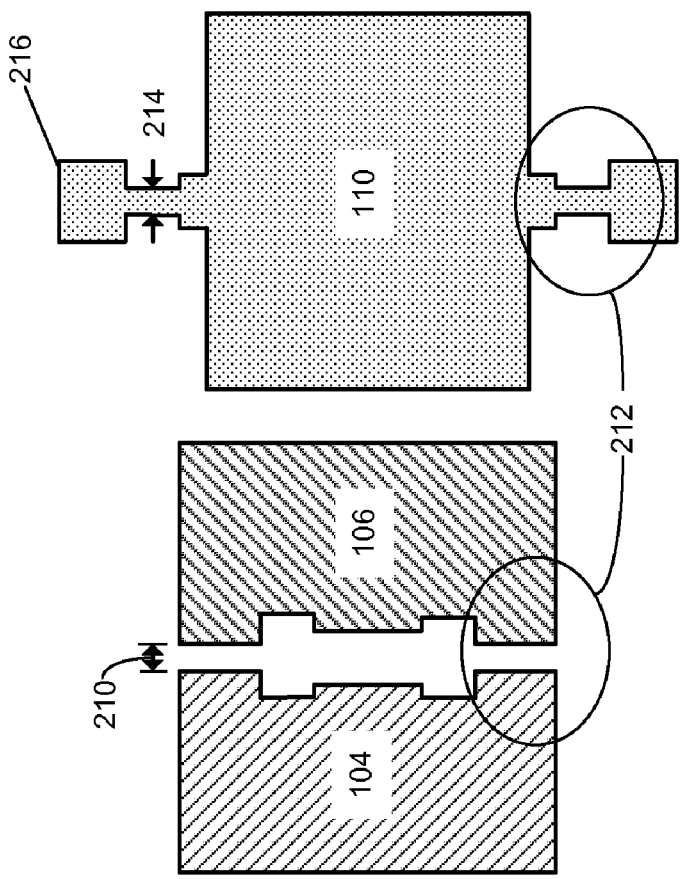
FIG. 2C illustrates optical proximity correction on phase shifters and trim features from FIG. 2B.

FIG. 3D illustrates a printed feature 312 in accordance with an embodiment of the invention. Note that the edges at 314 are straighter than that of FIG. 2D, which shows the result of conventional mask image based OPC. Outlines are shown for phase shifters 104 and 106 and for trim feature 110 for reference.

Figure 4B:
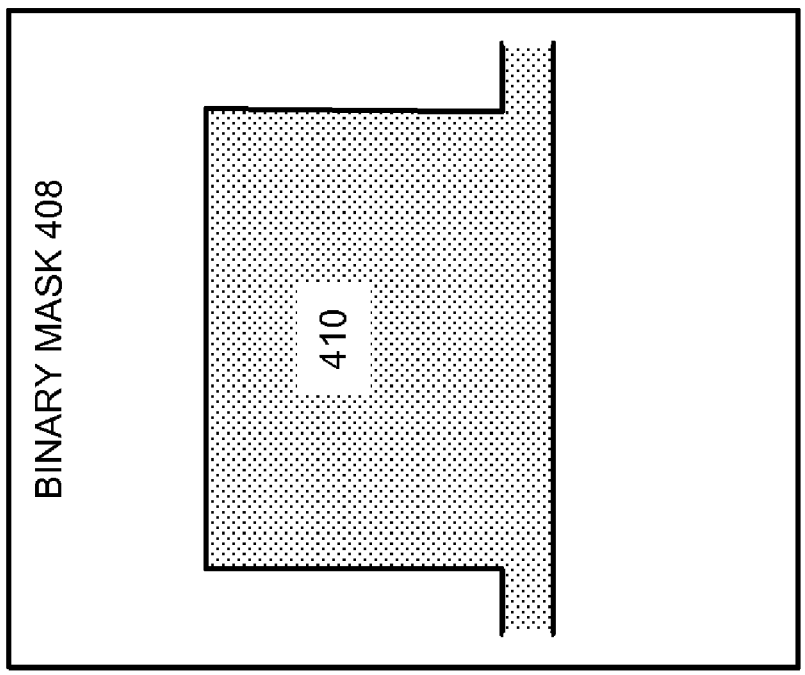
FIG. 4B illustrates a binary mask in accordance with an embodiment of the invention.
Figure 4A:
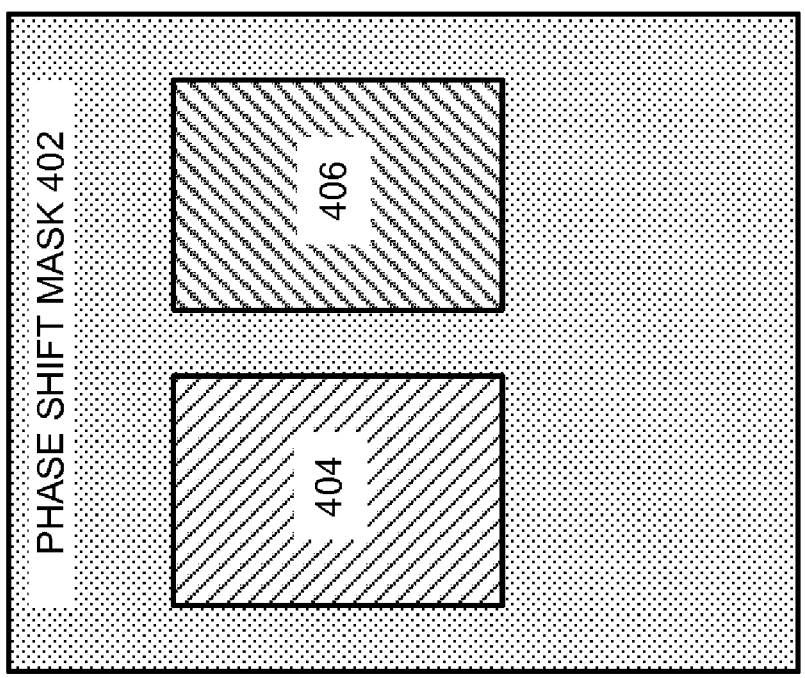
FIG. 4A illustrates a phase-shift mask in accordance with an embodiment of the invention.
Figure 4D:
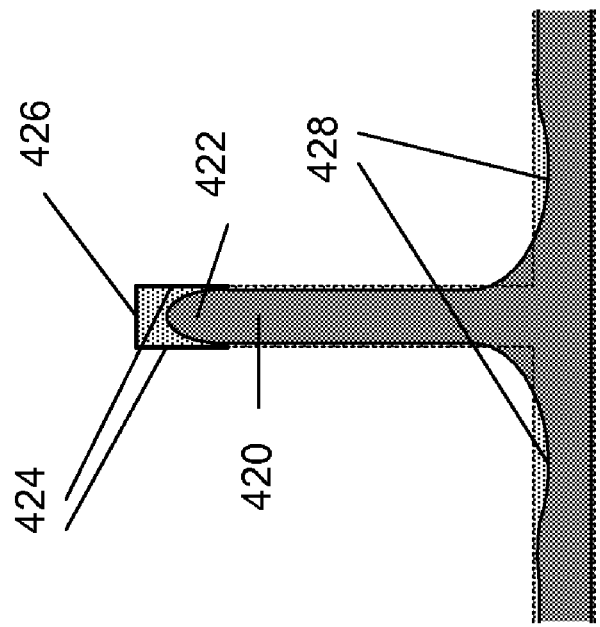
FIG. 4D illustrates an actual printed feature in accordance with an embodiment of the invention.
Figure 4C:
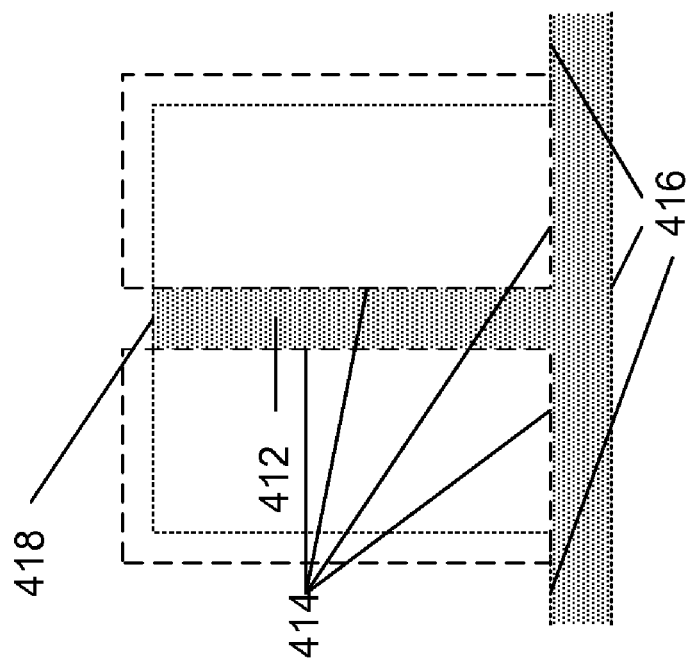
FIG. 4C illustrates a desired printed feature in accordance with an embodiment of the invention.

FIG. 4A and FIG. 4B illustrate a set of double exposure phase shift masks to produce the desired printed image shown in FIG. 4C in accordance with an embodiment of the invention. In FIG. 4A, phase-shift mask 402 includes 0-degree phase shifter 404 and 180-degree phase shifter 406. In FIG. 4B, binary mask 408 includes trim feature 410. In FIG. 4C the phase shifters are shown as dashed lines and the trim features are shown as dotted lines for reference. During the first exposure by the phase-shift mask 402, the dashed edges 414 of the printed feature will be formed by exposing the resist within the phase shifter areas 404 and 406. During the second exposure by the trim mask 408, the dotted edges 416 and 418 of the printed feature will be formed by exposing the resist outside of the trim area 410.

As shown in FIG. 4C, the desired printed image 412 is a T-shaped structure, with line end 418. Note that neither the phase shifters 404 and 406, nor trim feature 410 alone fully describe desired printed feature 412. The correct shape of desired feature 412 can be identified only by determining the results of the multiple exposures—or from looking at the original layout that was used to create the masks 402 and 408. Therefore, the correction parameters that are applied to phase shifters 404 and 406 and to trim feature 410 can be determined only from desired feature 412.

FIG. 4D illustrates an actual printed image 420 by the two masks, prior to applying OPC. In addition to the usual problems caused by proximity effect such as line printing narrower than desired, there are two additional outstanding problem: the line end shortening at 422, and the necking effect at 428. The line end shortening or pullback is a well-known problem that occurs for all line end features. Line end features are identified by a short line end roof 426, sandwiched by two longer line end walls 424, where the line end roof is usually no longer than the maximum line end roof width, and the line end walls are usually no shorter than the minimum line end wall height. The photo-resist reacts to this particular kind of image formation to cause the additional line end shortening. The line end walls are formed by the phase shift mask. However, in the phase shift mask, the line end walls appear as part of the phase shift edges, and there is no hint of them been line end walls of a particular line end. Similarly line end roof is formed by part of the trim edge, but there is no indication of a line end roof in the trim mask either. In fact, the line end roof appears as part of a long edge in the trim mask, suggesting it is a line edge, not a line end. Only by looking at the target printed image is this line end feature obvious. This means that the edge portion of the trim mask 418 must be treated as line end, instead of as edge as it may appear in the trim mask. Consequently, dissection and evaluation point placement, resist threshold, and error tolerance for line end, not for edge, must be applied for the edge portion 418.

Similarly, neither the phase shift mask nor the trim mask suggests the necking effect at location 428. The necking is caused by the T-shaped target image from the combination of the two masks and the exposure system. One embodiment of the present invention described below in conjunction with FIG. 5 provides a mechanism to identify such shapes from the masks and subsequently provides OPC corrections to the mask corners and edges to reduce this necking effect.

Figure 5:
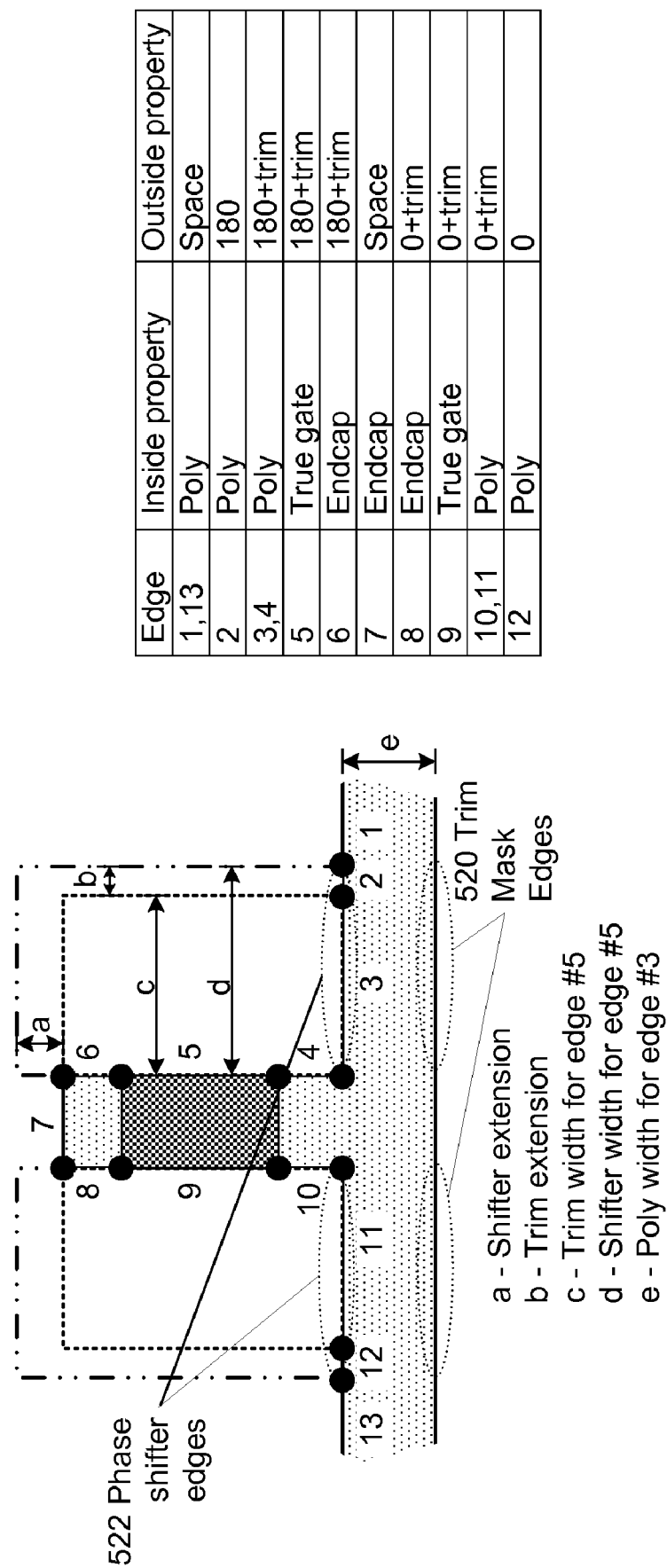
FIG. 5 illustrates shape specification using edge segments and their joints in accordance with an embodiment of the invention.

FIG. 5 illustrates shape specification using edge segments and their joints in accordance with an embodiment of the invention. The numbers on FIG. 5 correspond to the various edge segments with correspondence to individual masks while the letters correspond to different dimensions, which characterize the shapes. Edges 520 are the trim mask edges, while edges 522 are the phase shifter edges. See U.S. Pat. No. 6,523,162 B1, assigned to the assignee of this application for a description of an approach to shape-based specifications. Once a shape has been identified which is marked to indicate potential necking problems, the OPC process can apply special OPC treatments to correct the necking. For example, the phase shift edges and binary edges can be more densely dissected to capture line width variation and enable more effective correction. A similar shape-based approach can be used in the OPC process to handle difficult cases.

Figure 6:
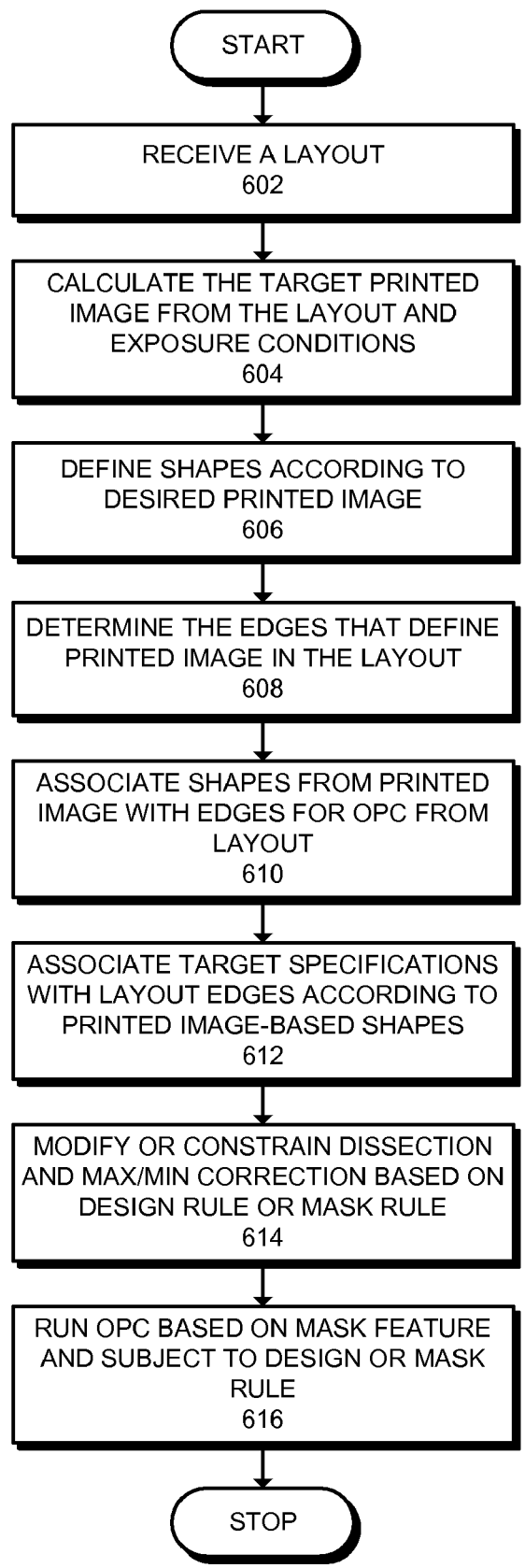
FIG. 6 presents a flowchart illustrating the process of performing optical proximity correction in accordance with an embodiment of the invention.

FIG. 6 presents a flowchart illustrating the process of performing optical proximity correction in accordance with an embodiment of the invention. The system starts by receiving a layout for an integrated circuit (step 602). Next, the system calculates the target printed image from the layout and the exposure conditions (step 604). This calculation involves simple Boolean operations and sizing operations. Shapes are then defined according to the desired printed image (step 606). A shape is multiple connected edges with length and angle constraints. For multiple exposure cases, the shapes on the mask image are typically not the same shapes on the wafer image.

The system next determines the edges that define the printed image in the layout (step 608). This is accomplished by matching the target image and the mask image, determining which edges will be resolved by which exposure, and then which edges will determine the printed image. The system then associates shapes from the printed image with edges for OPC from the layout (step 610). This association is accomplished by matching shapes in the target image with edges in the masks, which define the printing. Note that a target shape can be formed from edges from different masks and not from a single mask. In simple, single exposure masks, shapes are formed from edges form the same mask.

Next, the system associates target specifications with layout edges according to the printed image-based shapes (step 612). This includes edge dissection (coarse dissection for edges, fine dissection for corners), evaluation point placement (at center for edges, biased away from vertex for corners), tolerance (tighter on edges, looser on corners), and threshold (depending on resist properties).

The system then modifies or constrains the dissection and the max/min correction based on design rules or mask rules (Step 614). This modification includes potential serif size and the max/min correction amount for edges and corners. The edge or corner will be determined by the mask, not the target image as before. For example, a shifter outer corner may define an edge on the target image, but OPC will follow the corner design rule or mask rule.

Finally, the system executes an OPC based on mask features and subject to design or mask rules (step 616). This includes the correction type (e.g., bias or serif), minimum spacing, and minimum width (corner-to-corner vs. edge-to-edge).

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In some embodiments, the electromagnetic wave form includes one or more of the Proteus™ and iN-Tandem™ software programs, both from Synopsys, Inc., Mountain View, Calif., adapted to perform OPC on phase shift masks according to the process of FIG. 7.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for performing target-image-based optical proximity correction on masks that are used to generate an integrated circuit, comprising:
   receiving a plurality of masks that are used to expose features on the integrated circuit;
   computing a target image for a target feature defined by the plurality of masks, wherein a plurality of mask features from different masks define the target image; and
   performing an optical proximity correction (OPC) operation on the plurality of masks, wherein the OPC operation uses parameters associated with geometric characteristics of the target image to perform optical proximity correction on mask features that define the target image, instead of using dissection parameters associated with geometric characteristics of the mask features.

2. The method of claim 1, wherein performing the OPC operation involves dissecting a mask feature from the plurality of mask features into a plurality of segments, wherein dissecting the mask features involves using dissection parameters associated with geometric characteristics of the target image, instead of using dissection parameters associated with geometric characteristics of the mask feature.

3. The method of claim 1, wherein different OPC parameters are associated with line edges, space edges, outer corners, inner corners, line ends, and slot ends of the target image.

4. The method of claim 1, wherein performing OPC on a mask feature involves placing evaluation points on the plurality of segments, and using dissection and associated evaluation points in performing the OPC operation on the mask feature.

5. The method of claim 1, wherein placing evaluation points on the mask feature involves using evaluation point placement rules associated with geometric characteristics of the target image, instead of using evaluation point placement rules associated with geometric characteristics of the mask feature.

6. The method of claim 1, wherein performing an OPC operation on a mask feature from the plurality of masks involves using a resist threshold associated with geometric characteristics of the target feature instead of geometric characteristics of the mask feature.

7. The method of claim 1, wherein performing an OPC operation on the mask feature involves using tolerances associated with geometric characteristics of the target feature instead of tolerances associated with geometric characteristics of the mask feature.

8. The method of claim 1, wherein the plurality of masks includes at least one phase-shift mask and at least one trim mask.

9. The method of claim 1, wherein computing the target image for the target feature involves computing the target shape based on a shape specification defined by a printed image and which refers back to corresponding mask features from a plurality of masks.

10. A computer-readable storage medium storing instructions that when executed by a computer cause the computer to perform a method that performs target-image-based optical proximity correction on masks that are used to generate an integrated circuit, the method comprising:
   receiving a plurality of masks that are used to expose features on the integrated circuit;
   computing a target image for a target feature defined by the plurality of masks, wherein a plurality of mask features from different masks define the target image; and
   performing an optical proximity correction (OPC) operation on the plurality of masks, wherein the OPC operation uses parameters associated with geometric characteristics of the target image to perform optical proximity correction on mask features that define the target image, instead of using dissection parameters associated with geometric characteristics of the mask features.

11. The computer-readable storage medium of claim 10, wherein performing the OPC operation involves dissecting a mask feature from the plurality of mask features into a plurality of segments, wherein dissecting the mask features involves using dissection parameters associated with geometric characteristics of the target image, instead of using dissection parameters associated with geometric characteristics of the mask feature.

12. The computer-readable storage medium of claim 10, wherein different OPC parameters are associated with line edges, space edges, outer corners, inner corners, line ends, and slot ends of the target image.

13. The computer-readable storage medium of claim 10, wherein performing OPC on a mask feature involves placing evaluation points on the plurality of segments, and using dissection and associated evaluation points in performing the OPC operation on the mask feature.

14. The computer-readable storage medium of claim 10, wherein placing evaluation points on the mask feature involves using evaluation point placement rules associated with geometric characteristics of the target image, instead of using evaluation point placement rules associated with geometric characteristics of the mask feature.

15. The computer-readable storage medium of claim 10, wherein performing an OPC operation on a mask feature from the plurality of masks involves using a resist threshold associated with geometric characteristics of the target feature instead of geometric characteristics of the mask feature.

16. The computer-readable storage medium of claim 10, wherein performing an OPC operation on the mask feature involves using tolerances associated with geometric characteristics of the target feature instead of tolerances associated with geometric characteristics of the mask feature.

17. The computer-readable storage medium of claim 10, wherein the plurality of masks includes at least one phase-shift mask and at least one trim mask.

18. The computer-readable storage medium of claim 10, wherein computing the target image for the target feature involves computing the target shape based on a shape specification defined by a printed image and which refers back to corresponding mask features from a plurality of masks.

19. An apparatus that performs target-image-based optical proximity correction on masks that are used to generate an integrated circuit, comprising:
   a receiving mechanism configured to receive a plurality of masks that are used to expose features on the integrated circuit;
   a computing mechanism configured to compute a target image for a target feature defined by the plurality of masks, wherein mask features from different masks define the target image; and
   an optical proximity correction (OPC) mechanism configured to perform an OPC operation on the plurality of masks, wherein the OPC operation uses parameters associated with geometric characteristics of the target image to perform optical proximity correction on mask features that define the target image, instead of using dissection parameters associated with geometric characteristics of the mask features.

20. The apparatus of claim 19, wherein the OPC mechanism is configured to dissect a mask feature from the plurality of mask features into a plurality of segments, wherein dissecting the mask features involves using dissection parameters associated with geometric characteristics of the target image, instead of using dissection parameters associated with geometric characteristics of the mask feature.

* * * * *